US010177298B1

(12) United States Patent
Taylor et al.

(10) Patent No.: US 10,177,298 B1
(45) Date of Patent: Jan. 8, 2019

(54) NANOWIRE-BASED SUPERCONDUCTING ELECTROSTRICTIVE DEVICE

(71) Applicants: Benjamin J. Taylor, Escondido, CA (US); Teresa H. Emery, San Diego, CA (US); Susan Anne Elizabeth Berggren, San Diego, CA (US); Anna M. Leese de Escobar, Encinitas, CA (US)

(72) Inventors: Benjamin J. Taylor, Escondido, CA (US); Teresa H. Emery, San Diego, CA (US); Susan Anne Elizabeth Berggren, San Diego, CA (US); Anna M. Leese de Escobar, Encinitas, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/715,273

(22) Filed: Sep. 26, 2017

(51) Int. Cl.
*H01L 39/22* (2006.01)
*H01B 12/02* (2006.01)
(Continued)

(52) U.S. Cl.
CPC .......... *H01L 39/223* (2013.01); *H01B 12/02* (2013.01); *H01L 21/02019* (2013.01); *B82Y 99/00* (2013.01)

(58) Field of Classification Search
CPC ............... H01L 39/223; H01B 12/02
(Continued)

(56) References Cited

U.S. PATENT DOCUMENTS 9,188,514 B1 11/2015 Taylor
9,450,165 B1 9/2016 Taylor
(Continued)

OTHER PUBLICATIONS

McCaughan, Adam et al., "A Superconducting-Nanowire Three-Terminal Electrothermal Device", American Chemical Society Nano Letters, 14, 5748-5753, dx.doi.org/1j0.1021/nl502629x (2014).
(Continued)

*Primary Examiner* — Igwe U Anya
(74) *Attorney, Agent, or Firm* — SPAWAR Systems Center Pacific; Kyle Eppele; Arthur Samora

(57) ABSTRACT

A Josephson junction device and methods for manufacture can include an untwinned $YBa_2Cu_3O_x$ nanowire having crystallographic a- and b-axes. The nanowire can be established from $YBa_2Cu_3O_x$ film ($6.0 \leq x \leq 7.0$) using a photolithography process, followed by an ion milling process, to yield the $YBa_2Cu_3O_x$ nanowire. The crystallographic b-axis of the nanowire can be parallel to the long dimension of the nanowire. First and second gate structures can be placed on opposite sides of the nanowire across from each other, to establish first and second microgaps. A gate voltage can be selectively applied across the first and said second gate structures, which can further establish a selective electric field across the first and second microgaps. The electric field can be parallel to the nanowire crystallographic a-axis, to selectively cause an at will Josephson junction effect.

19 Claims, 4 Drawing Sheets

(51) Int. Cl.
*H01L 21/02* (2006.01)
*B82Y 99/00* (2011.01)

(58) Field of Classification Search
USPC .......................................................... 257/36
See application file for complete search history.

(56) References Cited

U.S. PATENT DOCUMENTS

| | | | |
|---|---|---|---|
| 2003/0042481 A1* | 3/2003 | Tzalenchuk | B82Y 10/00 257/31 |
| 2003/0201495 A1* | 10/2003 | Doderer | H01L 49/003 257/347 |
| 2014/0113828 A1* | 4/2014 | Gilbert | H01L 39/126 505/100 |
| 2016/0028402 A1 | 1/2016 | McCaughan et al. | |
| 2017/0133576 A1* | 5/2017 | Marcus | H01L 39/223 |

OTHER PUBLICATIONS

Taylor, Benjamin J. et al., "Correlation of Structural, Magnetic, and Electronic Transitions of a Novel Charge-Gradient YBa2Cu3Ox Film", American Physical Society, Phys. Rev. B 91, 144511, 10.1103/PhysRevB.91.144511 (2015).
Taylor, Benjamin J. et al., "Preparation of Novel HTS Films and Tunnel Junctions for Advanced C3I Sensor Applications", Proc. SPIE 9467, 946725 (2015).
Taylor, Benjamin et al., In-Plane Josephson Junction Array Terahertz Laser, Unpublished U.S. Appl. No. 15/638,928, filed Jun. 30, 2017.
Taylor, Benjamin et al., "Method for Creating High-Resolution Micro- to Nano-Scale Structures in High-Temerature Superconductor Films", Unpublished U.S. Appl. No. 15/200,674, filed Jul. 1, 2016.

* cited by examiner $T_c(wire) < T < T_c(nano\text{-}island)$

NANOWIRE-BASED SUPERCONDUCTING ELECTROSTRICTIVE DEVICE

FEDERALLY SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac22@navy.mil, referencing 103991.

FIELD OF THE INVENTION

The present invention pertains generally to components for causing a Josephson junction effect. More specifically, the present invention can pertain to components and associated manufacture methods that allow for selective activation of the Josephson junction function. The invention is particularly, but not exclusively, useful as a Josephson junction component and methods for manufacture that can implement a controlled gating electric field that can be turned on and off at will to achieve the Josephson junction effect, but without inherent performance degrading flux-trapping issues found in Josephson junction components in the prior art.

BACKGROUND OF THE INVENTION

A Josephson junction (JJ) can be a boundary region of material that provides a weak link between two fully superconducting regions through which paired superconducting electrons can tunnel via a quantum mechanical process. Recently, the development of a prior art 3-terminal, nanowire-based superconducting electro-thermal device, referred to as an nTron has been reported, which has no Josephson junctions, but can perform the same circuit functions as a JJ. The nTron can use a localized, Joule-heated hotspot that is formed in the gate to modulate current flow in a perpendicular superconducting channel. A particular advantage of the nTron is that it can exhibit sensitivity sufficient to detect single flux quanta, but does not require integration into superconducting loops such as superconducting quantum interference devices (SQUIDs), and so can avoid the issue of trapped flux in electromagnetically noisy environments. However, one disadvantage of such a device can be that the application is heat is required to selectively achieve the Josephson junction effect, so the device, must be heated and cooled, which can be difficult to control, and further which can be difficult to achieve rapid activation/deactivation cycles.

The device proposed here can take advantage of avoiding flux trapping issues. However, the device of the present invention can be distinct in that it can use an input gate field instead of the application of heat to induce changes in the conductivity of the nanowire channel. A local electric field applied across an untwined nanowire can cause a nano-scale strain which in turn causes the affected region to enter the normal state, effectively creating an at will Josephson junction. Such a device can have potential applications in classical and quantum communications. It can be integrated with many existing high critical temperature (high-$T_c$) superconducting technologies.

In view of the above, it can be an object of the present invention to provide Josephson junction components and methods for manufacture that can detect single flux quanta. Another object of the present invention can be to provide Josephson junction components and methods for manufacture that can achieve a Josephson junction effect without applying heat to the component. Yet another object of the present invention can be to provide Josephson junction components and methods for manufacture that does not require integration into superconducting loops, also known as superconducting quantum interference devices (SQUIDs). Yet another object of the present invention can be to provide Josephson junction components and methods for manufacture that can selectively and rapidly activate/deactivate the Josephson junction through the use of an electric field. Still another object of the present invention can be to provide Josephson junction components and methods for manufacture that can be easily implemented in a cost-effective manner.

SUMMARY OF THE INVENTION

A Josephson junction device and methods for manufacture there can include an $YBa_2Cu_3O_x$ film. The $YBa_2Cu_3O_x$ film can be untwinned and can have a crystallographic a-axis and a crystallographic b-axis. A nanowire can be defined in the formed in the $YBa_2Cu_3O_x$ film using a photolithography process, and then portions of the untwinned $YBa_2Cu_3O_x$ film other than the nanowire can be etched away using an ion milling process to yield a $YBa_2Cu_3O_x$ nanowire. The crystallographic b-axis can be parallel to the long dimension of the nanowire, and $YBa_2Cu_3O_x$ can have an $O_x$ value in the range between 6.0 and 7.0 ($6.0 \leq x \leq 7.0$).

The device can further include a first gate structure and a second gate structure that can be placed opposite from each other on either side of the nanowire. The placement of the first gate structure and second gate structure can establish a first microgap and a second microgap across the gate structure. A gate voltage can be selectively applied across the first and said second gate structures, which can further establish a selective electric field across said first microgap and said second microgap that is parallel to the crystallographic a-axis, to cause an at will Josephson junction effect.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

A Josephson junction (JJ) can be a boundary region of material that can provide a weak link between two fully superconducting regions through which paired superconducting electrons can tunnel via a quantum mechanical process. Recently, the prior art reported the development of a 3-terminal, nanowire-based superconducting electro-thermal device, referred to as an nTron, which has no Josephson junctions, but which can perform the same circuit functions as a JJ. The nTron can use a localized, Joule-heated hotspot that is formed in the gate to modulate current flow in a perpendicular superconducting channel. A particular advantage of the nTron is that it exhibits sensitivity sufficient to detect single flux quanta, but does not require integration into superconducting loops (SQUIDs) and so can avoid the issue of trapped flux in electromagnetically noisy environments.

Figure 1:
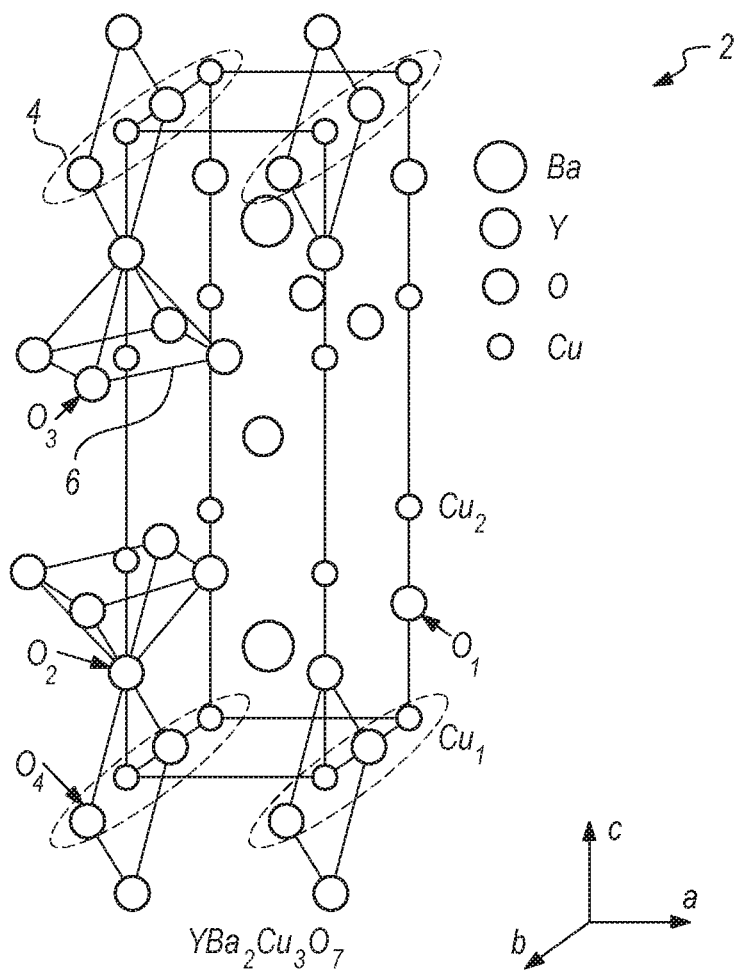
FIG. 1 can be a depiction of a lattice structure of a fully oxygenated $YBa_2Cu_3O_x$ (YBCO) molecule with defined a-, b- and c-axes as known in the prior art, which can be used to make a YBCO film for the present invention.

The present invention according to several embodiments can also be structured to accomplish a Josephson junction effect, while avoiding the above-cited issue of trapped flux, but without heating of the device, by applying an electric field across certain Yttrium Barium Copper Oxide (YBCO) materials in a certain manner, to take advantage of YBCO material properties. To do this, and referring initially to prior art FIG. 1, a prior art depiction of the lattice structure of a fully oxygenated YBCO molecule (unit cell) 2 can be shown. When YBCO twinning occurs, there are two possible alignments of the twin structures in the a-b plane. The unit cells within a twin structure are aligned, but a nearly 90 degree rotation of the unit cell between the two twinning directions can exist. As shown in FIG. 1, YBCO can have two different Cu sites, the Cu (1) chain site 4, and the Cu (2) plane site 6. The Cu (1) O chain sites 4 are known to order along the b-axis direction. It has also been established in the prior art that, in the region of optimal oxygen doping (7−x≈6.93), uniaxial pressure along the a-axis (b-axis) suppresses (enhances) the value of $T_c$. The opposing effects of applied pressure along the a- and b-axes on $T_c$ are nearly equal, though most studies in the prior art can indicate that $|dT_c/dp_a| < |dT_c/dp_b|$.

Through the application of uniaxial pressure to a substrate upon which a film of over-doped YBCO (YBCO having an oxygen content close to $O_7$) has been deposited under unique thermal and atmospheric conditions, a high level of crystalline order in the a-b plane (i.e., in the direction of the crystallographic a-axis and crystallographic b-axis in FIG. 1) may be induced. This can result in untwinned YBCO film with the c-axis oriented perpendicular to the a-b plane (as used herein, the terms "untwinned" and "detwinned" can be used interchangeably, and can be taken to mean that same thing). The manner in which an untwinned YBCO film can be made is described more fully in U.S. Pat. No. 9,450,165 by Benjamin J. Taylor for an invention entitled "Apparatus and Method for Production of Untwinned YBCO Films", which is assigned to the same assignee as the present invention. The contents of the '165 patent are hereby incorporated by reference herein.

Figure 3:
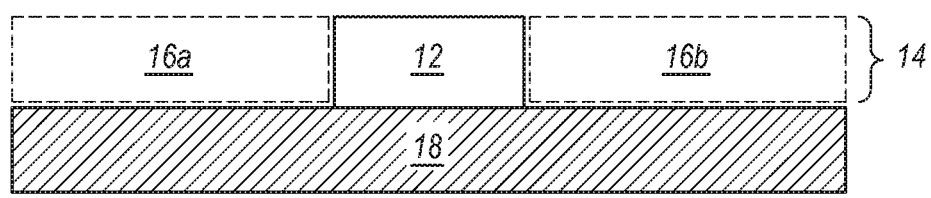
FIG. 3 can be a cross-sectional view of a nanowire of the component of FIG. 2, which can be made from YBCO film, and which can be incorporated into the device and methods of the present invention, FIG. 4 can be a top plan view of an alternative embodiment of the component of FIG. 3.

Referring now to FIGS. 2-6 the Josephson junction device (in this disclosure, the terms "device" and "component" are used interchangeably and can be taken to have the same meaning) of the present invention can be shown and can be generally designated by reference character 10. As shown, device 10 can include a nanowire 12. As shown in FIG. 3, nanowire 12 can be formed from YBCO film 14. To do this, and referring to FIG. 3, untwinned YBCO film 14 can be formed on substrate 18 in the manner described above and in the '165 patent. Next, nanowire 12 can be formed from untwinned YBCO film 14. To do this, nanowire can be defined in film 14 using a photolithography process (other processes could certainly be used) so that the long dimension of nanowire 12 can be parallel with the crystallographic b-axis of film 14. Next, the unneeded portions 16a, 16b of film 14 (shown in phantom in FIG. 3) can be etched away using an ion milling process so that only nanowire 12 remains, as shown in FIG. 3.

One ion milling process that could be used can be described more fully in U.S. patent Ser. No. 15/638,928 by Benjamin J. Taylor et al. for an invention entitled "In-Plane Josephson Junction Array Terahertz Laser", which is assigned to the same assignee as the present invention. The contents of the '928 application are hereby incorporated by reference herein. Other processes could also be used. With respect to the untwinned $YBa_2Cu_3O_x$ film, film 14 can have an $O_x$ value in the range between 6.0 and 7.0 (6.0≤x≤7.0).

Figure 2:
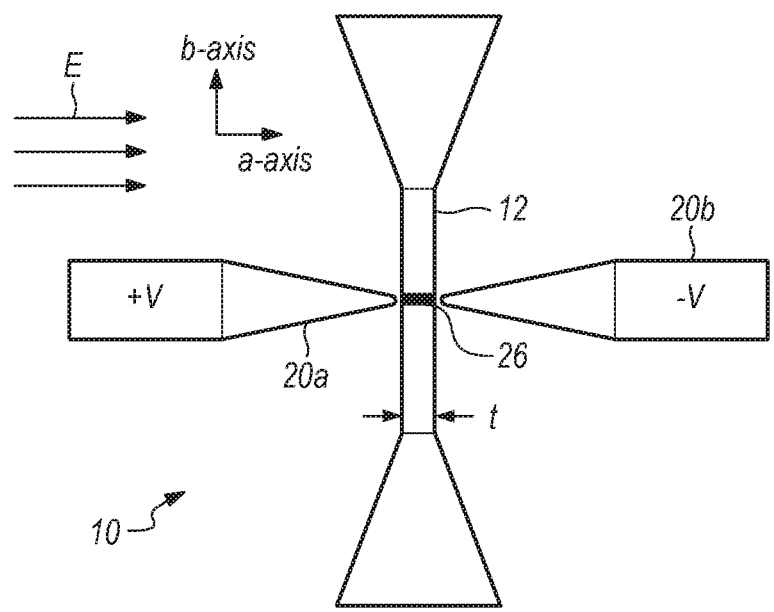
FIG. 2 can be a top plan view of a Josephson junction component of the present invention according to several embodiments.
Figure 5:
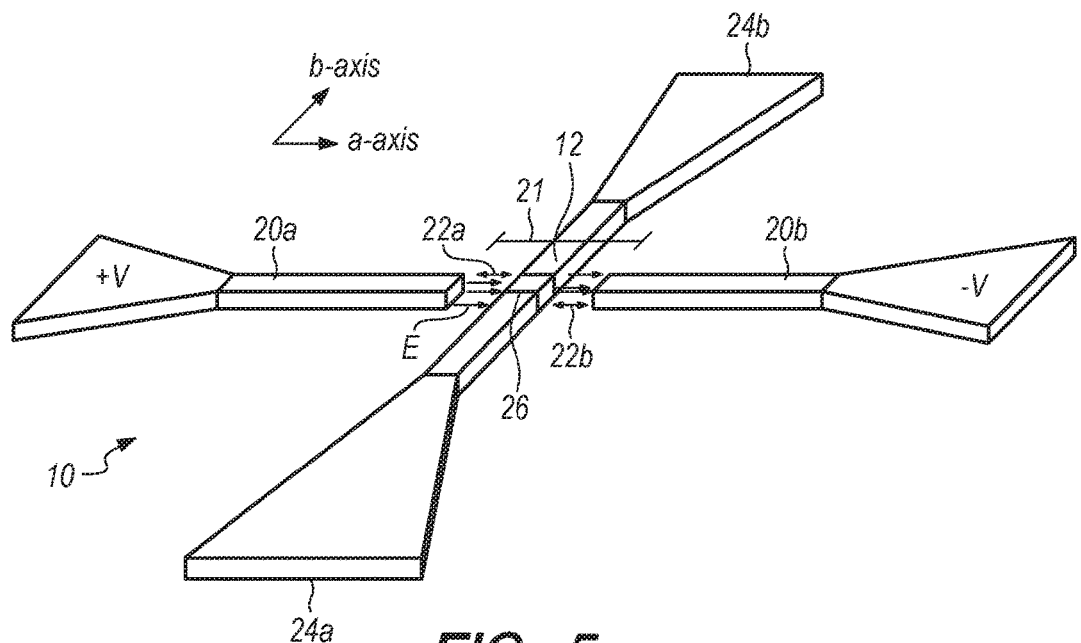
FIG. 5 can be an enlarged side elevational view of the component of FIG. 3, which can show the electrostrictive junction in greater detail.

Once nanowire 12 is formed, and referring now primarily to FIGS. 2 and 5, the device and methods of the present invention can further include a first gate structure 20a and a second gate structure 20b, which can be spaced apart by interstice 21 (best seen in FIG. 5). Nanowire 12 can be positioned in interstice 21 between first gate structure 20a and second gate structure 20b, to establish a first microgap 22a and a second microgap 22b on either side of nanowire 12. In some embodiments, the widths of microgaps 22a, 22b can be equal to each other, and in other embodiments the widths of microgaps 22 can further equal to the thickness t of nanowire 12. Nanowire 12 can further merge into contacts 24a, 24b, which can be made of gold or other materials as known in the art.

With the above structure, an electric field E can be established across interstice 21. To do this a voltage potential can be established across gate structures 20a, 20b, as shown in FIGS. 2 and 4-6. Because of the material manufacture properties and orientation of nanowire 12, electric field E can be in oriented so that it is parallel with the crystalline a-axis of component 10, as shown in FIGS. 2 and 5.

With the structure and orientation of structure, the electric field produced by the voltage gate terminals can induce an electrostrictive response in nanowire 12, as depicted by an electrostrictive region 26 in nanowire 12 (FIGS. 2 and 5), which can further cause a local reduction in the strength of the superconducting pairing mechanism in region 26. Within a range of applied electric fields and temperatures, i.e. high superconducting (high $T_c$) temperatures, electrostrictive region 26 can re-enter the normal state and form a barrier tunneling region analogous to the aforementioned nTron and conventional Josephson junctions, to achieve the aforementioned Josephson junction effect. For the present invention, for a twenty nanometer (20 nm) width for microgaps 22a and 22b, and a 20 nm thickness t for nanowire 12, a six millivolt (6 mV) voltage across first gate structure 20a and second gate structure 20b can produce a 100 kV/m electric field E. An electric field E strength ~100 kV/m can produce a reduction in the superconducting transition temperature $T_c$ of approximately fifteen degrees Kelvin (15° K). Other thicknesses and widths between 10 and 100 nm, and other voltages could be used, depending on the widths of interstice 21 and microgaps 22, the thickness t of nanowire 12 and the chosen $O_x$ doping content of film 14 (and resulting nanowire 12), as selected by the end manufacturer due to design constraints and other factors. Moreover a nanowire thickness of up to a micron is envisioned for some embodiments, provided a sufficient voltage can be applied across the gate structure to cause an electric field E strength of sufficient strength to achieve the Josephson junction effect in electrostrictive region 26, but without causing leakage current or other breakdown effects.

Figure 4:
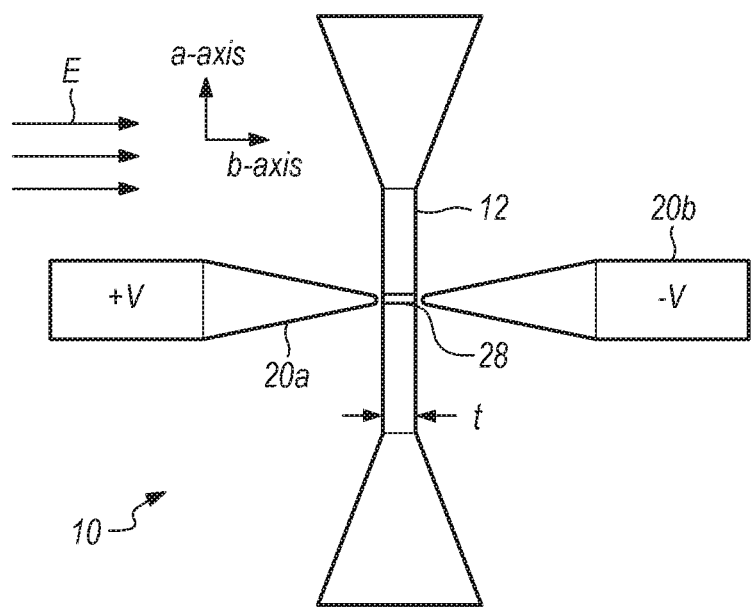
Figure 6:
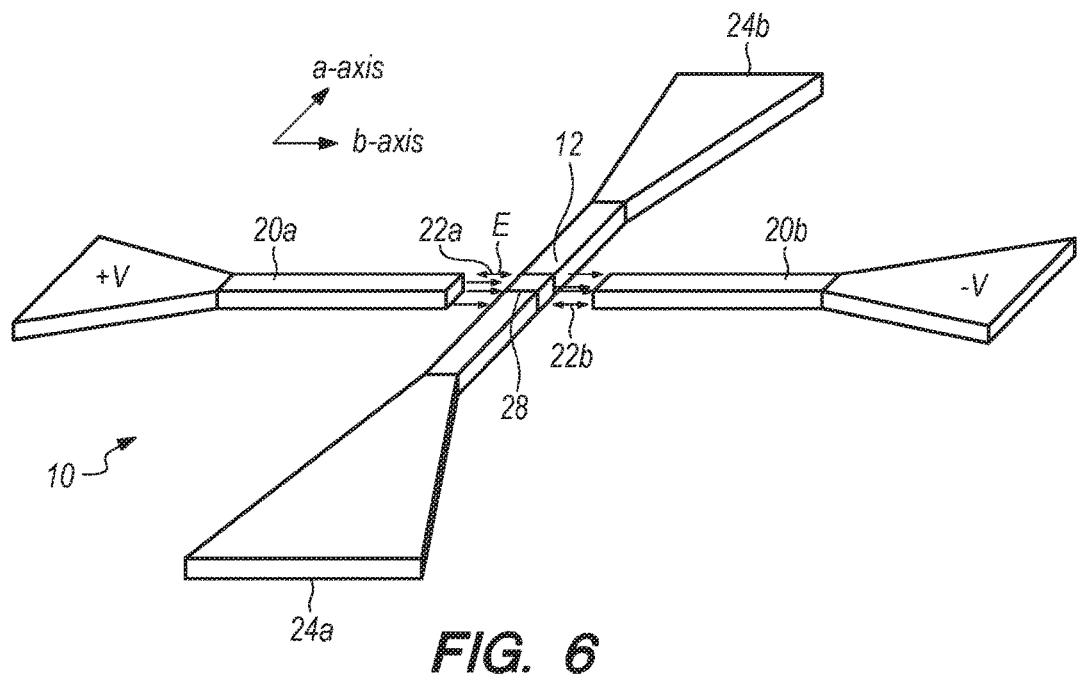
FIG. 6 can be an enlarged side elevational view of the component of FIG. 4, which can show the superconducting nano-island in greater detail; and, FIG. 7 can be a block diagram that is illustrative of steps that can be taken to accomplish some of the methods of the present invention according to several embodiments.

For the alternative embodiments of the present invention, and referring now to FIGS. 4 and 6, device 10 can be integrated with many existing high-$T_c$ superconducting technologies. To do this, nanowire 12 can be formed from YBCO film 14. Next, first and second gate structures 20 can be placed on either side of nanowire 12 to establish respective microgaps 22, and a voltage V can be established across gate structures 20, which can further establish electric field E, as shown in FIGS. 4 and 6. But for some alternative embodiments of the present invention, field E can now be parallel with the crystallographic b-axis, so the establishment of the electric field E across microgaps 22 can establish a superconductive nano-island 28, as shown in FIG. 6. Thus, the selective activation of electric field E can establish superconductive nano-island 28, which can make the component 10 potentially useful as a photodetector, or a high sensitivity sensor for other types of radiation.

Figure 7:
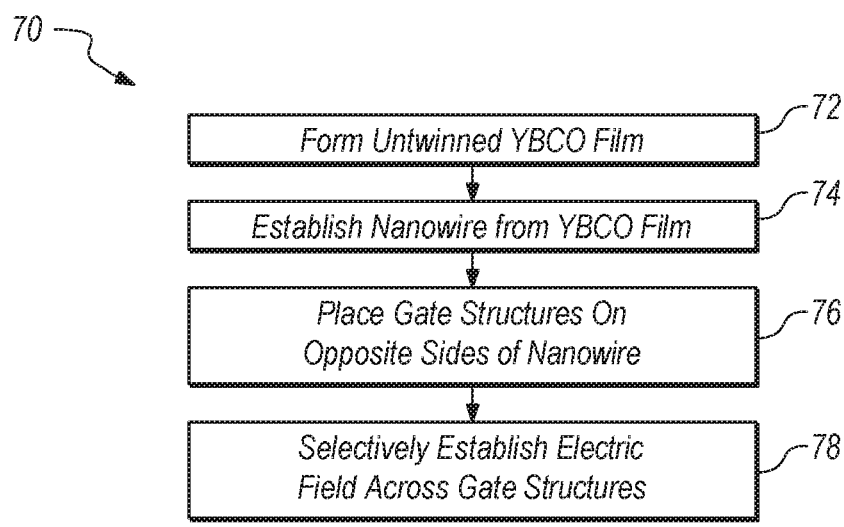

Referring now to FIG. 7, a block diagram is shown, which can be illustrative of steps that can be taken to practice the methods of the present invention. As shown, method 70 can include the step 72 of forming an untwinned YBCO film 14, followed by shaping a YBCO nanowire 12 from YBCO film 14, as indicated by box 74 in FIG. 7. The crystallographic a-axis and crystallographic b-axis of the long dimension of nanowire 12 can be chosen according to the particular embodiments of the device of the present invention that is being practiced, as described above.

Referring again to FIG. 7, the methods can further include the step 76 of placing first gate structure 20a and second gate structure 20b on opposite sides of nanowire 12. The placement of gate structure can further establish microgaps 22a and 22b on opposite sides of nanowire, as described above and shown in FIGS. 2 and 4-6. The methods can also include selectively establishing an electric field E across gate structures 20 and interstice 21, as indicated by box 78 in FIG. 7. One way to accomplish this can be by applying a gate voltage V across gate structures 20 as described above.

The device of the present invention according to several embodiments can be similar to the nTron with respect to performing the functions of a conventional Josephson junction, and also having the advantage of avoiding flux trapping issues. However, the component and methods of the present invention can be distinct in that an input gate elective field E can be used to induce changes in the conductivity of the YBCO nanowire 12, which can effectively create an at will Josephson junction at electrostrictive Josephson junction region 26. The device has potential applications in classical and quantum communications. This structure and cooperation of structure can allow the device and methods to perform the functions of a Josephson junction, but does not have the same inherent performance degrading flux-trapping issues that can be inherent in the prior art devices. Additionally, because the device 10 uses a controlled gating electric field E, the Josephson junction-like function can be rapidly turned on and off at will, creating a re-configurable circuit element. Such a function can serve as a logic element.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of the preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A Josephson junction, comprising:
    untwinned YBa2Cu3Ox film, said film having an a-axis and a b-axis;
    a nanowire having a nanowire thickness, said nanowire formed in said untwinned YBa2Cu3Ox film;
    a first gate structure and a second gate structure placed on opposite sides of said nanowire, said first gate structure establishing a first microgap and said second gate structure establishing a second microgap with said nanowire;
    said first microgap having a first microgap width, said second microgap having a second microgap width, said first microgap width, said second microgap width and said nanowire thickness being approximately equal; and,
    a gate voltage selectively applied to said first gate structure and said second gate structure, said gate voltage further establishing a selective electric field across said first microgap and said second microgap that is parallel to said a-axis to cause an at will Josephson junction effect.

2. The Josephson junction of claim 1, wherein said untwinned YBa2Cu3Ox film has an Ox value in the range between 6.0 and 7.0 ($6.0 \leq x \leq 7.0$).

3. The Josephson junction of claim 1, where said nanowire thickness is between fifteen and twenty-five nanometers (15 nm $\leq t \leq$ 25 nm).

4. The Josephson junction of claim 3 where said selective gate voltage is 6 mV.

5. The Josephson junction of claim 4 wherein said selective electric field is one hundred kilovolts per meter (100 kV/m).

6. The Josephson junction of claim 1, wherein said nanowire is formed in said YBa2Cu3Ox film by defining said nanowire using photolithography, followed by etching away unneeded portion of said YBa2Cu3Ox film using an ion milling process to yield said nanowire.

7. A method for selectively establishing a Josephson junction, comprising the steps of:
A) forming an untwinned YBa2Cu3Ox film having an a-axis and a b-axis;
B) establishing a nanowire in said YBa2Cu3Ox film;
C) placing a first gate structure and a second gate structure across from each other, on either side of said nanowire, to establish a first microgap and a second microgap; and,
D) selectively establishing an electric field across said first microgap and said second microgap, said electric field being co-linear with said a-axis.

8. The method of claim 7 wherein said step D) is accomplished by selectively activating a gate voltage across said first gate structure and said second gate structure.

9. The method of claim 8, wherein said gate voltage is 6 mV.

10. The method of claim 9, wherein said selective electric field is 100 kV/m.

11. The method of claim 7, wherein said step A) is accomplished to result in an untwinned YBa2Cu3Ox film with an Ox value in the range between 6.0 and 7.0 ($6.0 \leq x \leq 7.0$).

12. The method of claim 7, wherein said step B) is further accomplished by:
B1) defining said nanowire in said untwinned YBa2Cu3Ox film using photolithography; and,
B2) ion milling unneeded portions of said untwinned YBa2Cu3Ox film so that only said nanowire from said step B1) remains.

13. The method of claim 12, where the resulting thickness of said nanowire is between fifteen and twenty-five nanometers ($15 \text{ nm} \leq t \leq 25 \text{ nm}$).

14. A device, comprising:
a first gate structure;
a second gate structure spaced apart from said first gate structure to establish an interstice there between;
a gate voltage, said gate voltage establishing an electric field across said interstice; and,
a nanowire inserted into said interstice to form a first microgap having a first microgap width and a second microgap having a second microgap width, said nanowire having a long dimension and a nanowire thickness, said nanowire thickness, said first microgap width and said second microgap width being approximately equal, said nanowire being formed from an untwinned YBa2Cu3Ox film having a crystallographic a-axis and a crystallographic b-axis that are orthogonal, said long dimension being parallel with said crystallographic b-axis.

15. The device of claim 14, wherein said untwinned YBa2Cu3Ox film with an Ox value in the range between 6.0 and 7.0 ($6.0 \leq x \leq 7.0$).

16. The device of claim 14, wherein said nanowire is formed by defining said nanowire on said YBa2Cu3Ox film using a photolithography process, followed by etching away unneeded portions of said YBa2Cu3Ox film using an ion milling process, so that only said nanowire remains.

17. The device of claim 16, where the resulting thickness of said nanowire is between fifteen and twenty-five nanometers ($15 \text{ nm} \leq t \leq 25 \text{ nm}$).

18. The device of claim 14, wherein said gate voltage is 6 mV.

19. The device of claim 18, wherein said selective electric field is 100 kV/m.

* * * * *